(12) United States Patent
Clevenger et al.

(10) Patent No.: US 12,208,386 B2
(45) Date of Patent: Jan. 28, 2025

(54) 3D NANOCHANNEL INTERLEAVED DEVICES

(71) Applicant: International Business Machines Corporation, Armonk, NY (US)

(72) Inventors: Lawrence A. Clevenger, Saratoga Springs, NY (US); Kangguo Cheng, Schenectady, NY (US); Donald Canaperi, Bridgewater, CT (US); Shawn Peter Fetterolf, Cornwall, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 18/234,004

(22) Filed: Aug. 15, 2023

(65) Prior Publication Data

US 2023/0390763 A1    Dec. 7, 2023

Related U.S. Application Data

(62) Division of application No. 16/704,878, filed on Dec. 5, 2019, now Pat. No. 11,779,918.

(51) Int. Cl.
*B01L 3/00* (2006.01)
*B82B 1/00* (2006.01)
*B82B 3/00* (2006.01)

(52) U.S. Cl.
CPC ... *B01L 3/502707* (2013.01); *B01L 3/502715* (2013.01); *B82B 1/001* (2013.01);
(Continued)

(58) Field of Classification Search
CPC ......... B01L 3/502707; B01L 3/502715; B82B 1/001; B82B 3/0019; H01L 21/3081; H01L 21/02592
See application file for complete search history.

(56) References Cited

U.S. PATENT DOCUMENTS 7,250,074 B2    7/2007    Tonkovich et al.
7,604,781 B2    10/2009    Brophy et al.
(Continued)

FOREIGN PATENT DOCUMENTS

WO    WO2017087908 A1    5/2017

OTHER PUBLICATIONS

Davis et al., "Simulations for guiding the delivery and trapping of single biomolecules in a nanofluidic device," Proc. SPIE 7750, Photonics North, 775005 (Sep. 2010) (Abstract, 1 page).
(Continued)

*Primary Examiner* — Brian R Gordon
*Assistant Examiner* — Dwan A Gerido
(74) *Attorney, Agent, or Firm* — L. Jeffrey Kelly

(57) ABSTRACT

3D nanochannel interleaved devices for molecular manipulation are provided. In one aspect, a method of forming a device includes: forming a pattern on a substrate of alternating mandrels and spacers alongside the mandrels; selectively removing the mandrels from a front portion of the pattern forming gaps between the spacers; selectively removing the spacers from a back portion of the pattern forming gaps between the mandrels; filling i) the gaps between the spacers with a conductor to form first electrodes and ii) the gaps between the mandrels with the conductor to form second electrodes; and etching the mandrels and the spacers in a central portion of the pattern to form a channel (e.g., a nanochannel) between the first electrodes and the second electrodes, wherein the first electrodes and the second electrodes are offset from one another across the channel, i.e., interleaved. A device formed by the method is also provided.

20 Claims, 17 Drawing Sheets

(52) U.S. Cl.
CPC ......... *B82B 3/0019* (2013.01); *B01L 2200/12* (2013.01); *B01L 2300/0645* (2013.01); *B01L 2300/0896* (2013.01); *B01L 2300/12* (2013.01)

(56) References Cited

U.S. PATENT DOCUMENTS

| | | | |
|---|---|---|---|
| 9,114,402 | B2 | 8/2015 | Yamamoto |
| 9,651,518 | B2 | 5/2017 | Afzali-Ardakani et al. |
| 9,745,625 | B2 | 8/2017 | Chan |
| 9,837,405 | B1* | 12/2017 | Cheng ............... H01L 21/31111 |
| 2015/0316529 | A1 | 11/2015 | Choi et al. |
| 2016/0377591 | A1 | 12/2016 | Kawai et al. |
| 2017/0047285 | A1* | 2/2017 | Cheng ............... H01L 29/66568 |
| 2021/0170399 | A1 | 6/2021 | Clevenger et al. |

OTHER PUBLICATIONS

Leanhardt et al., "High-resolution spectroscopy on trapped molecular ions in rotating electric fields: A new approach for measuring the electron electric dipole moment," Journal of Molecular Spectroscopy, vol. 270, issue 1, pp. 1-25 (Nov. 2011).

Nguyen et al., "Mixing in microchannels based on hydrodynamic focusing and time-interleaved segmentation: modelling and experiment," Lab Chip, 5, 1320-1326 (Sep. 2005) (Abstract, 3 pages).

Nguyen et al., "Mixing in microchannels based on hydrodynamic focusing and time-interleaved segmentation: modeling and experiment," Proc. SPIE 6036, BioMEMS and Nanotechnology II (Jan. 2006) (Abstract, 3 pages).

List of IBM Patents or Applications Treated as Related, Aug. 15, 2023 (2 pages).

* cited by examiner

3D NANOCHANNEL INTERLEAVED DEVICES

FIELD OF THE INVENTION

The present invention relates to nano-fabricated devices, and more particularly, to three-dimensional (3D) nanochannel interleaved devices for molecular manipulation using dipole moments.

BACKGROUND OF THE INVENTION

Molecular-level control of compounds has important applications in a variety of fields. In medicine, for instance, manipulation of molecules at the molecular level can be used to control the composition of medications. Such a fine-tuned control over the composition of medications can enable the creation of customized medicines and specific dosing. Further, molecular-level control can provide more efficient delivery systems for medications, thus advancing treatment options and efficacy.

However, the ability to effectively manipulate molecules at the molecular level remains challenging and difficult. Technology does not currently exist for production-scale molecular manipulation.

Accordingly, improved techniques for efficient and effective manipulation of molecules at the molecular level would be desirable.

SUMMARY OF THE INVENTION

The present invention provides three-dimensional (3D) nanochannel interleaved devices for molecular manipulation. In one aspect of the invention, a method of forming a device for molecular manipulation is provided. The method includes: forming a pattern on a substrate of alternating mandrels and spacers alongside the mandrels; selectively removing the mandrels from a front portion of the pattern forming gaps between the spacers; selectively removing the spacers from a back portion of the pattern forming gaps between the mandrels; filling i) the gaps between the spacers with a conductor to form first electrodes and ii) the gaps between the mandrels with the conductor to form second electrodes; and etching the mandrels and the spacers in a central portion of the pattern to form a channel (e.g., a nanochannel) between the first electrodes and the second electrodes, wherein the first electrodes and the second electrodes are offset from one another across the channel, i.e., interleaved.

In another aspect of the invention, a device is provided. The device includes: a channel (e.g., a nanochannel); first electrodes disposed in between spacers on a first side of the channel; and second electrodes disposed in between mandrels on a second side of the channel, wherein the first electrodes and the second electrodes are offset from one another across the channel, i.e., interleaved.

A more complete understanding of the present invention, as well as further features and advantages of the present invention, will be obtained by reference to the following detailed description and drawings.

DETAILED DESCRIPTION OF PREFERRED EMBODIMENTS

Provided herein are three-dimensional (3D) device structures for molecular manipulation that leverage the dipole within the molecule, as well as current nanofabrication techniques to precisely manufacture extremely small features, e.g., dimensions ranging from several micrometers (μm) to 10's of nanometers (nm). Further, the present techniques improve resolution through the interleaving of 3D spirally located electrodes enabling a much finer level of control and manipulation.

Namely, as will be described in detail below, advanced patterning techniques are leveraged herein to place the (interleaved) electrodes for field generation at precise locations at a molecular scale. Advanced etching techniques are used to precisely place channels of a nanoscale size at the center of the electrodes. By 'interleaved' it is meant that, instead of being directly opposite one another, the electrodes on opposite sides of the nanochannel are offset from one another.

Advantageously, the present 3D device structures permit the electro-kinetic control of individual molecules using the dipoles inherent in the subject material. For instance, during operation, applying a field selectively to portions of a molecule (via the electrodes) will electrokinetically orient and/or locomote the molecule in the nanochannel as a result of dynamic electric field application. Individual electrodes can be controlled individually and intelligently.

Figure 1:
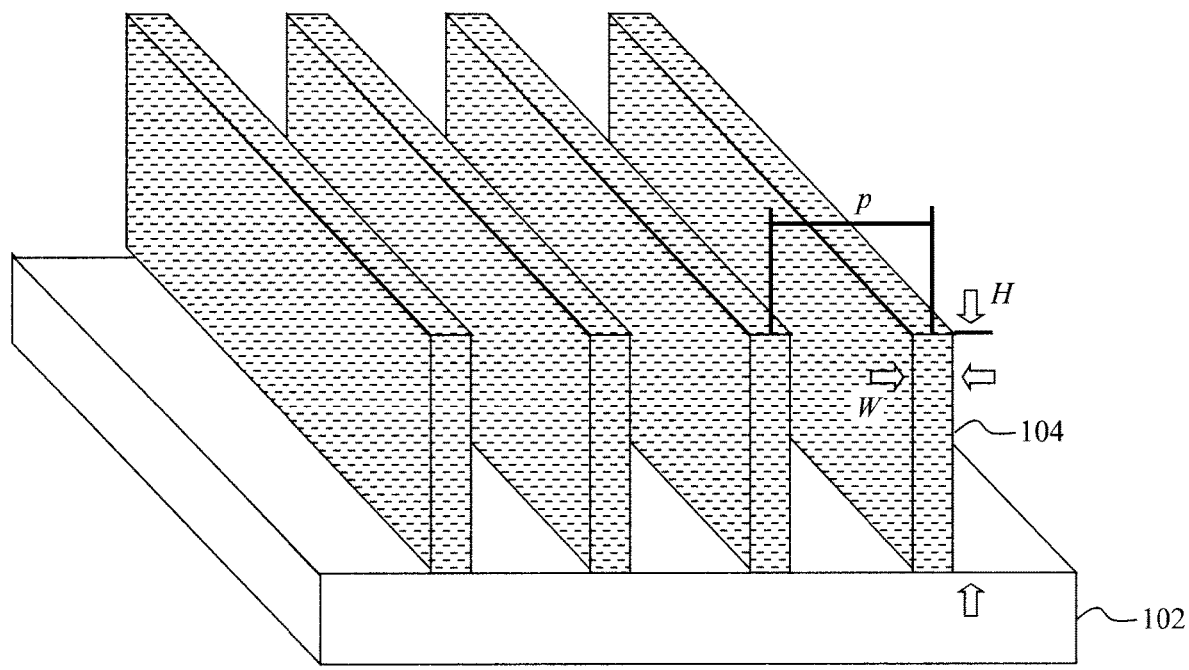
FIG. 1 is a three-dimensional diagram illustrating mandrels having been formed on a substrate according to an embodiment of the present invention.

An exemplary methodology for forming a 3D device for molecular manipulation is now described by way of reference to FIGS. 1-17. As shown in FIG. 1, the process begins with the formation of mandrels 104 on a substrate 102.

According to an exemplary embodiment, substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes an SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 102 may already have pre-built structures (not shown) such as transistors, diodes, capacitors, resistors, isolation regions (e.g., shallow trench isolation (STI) regions), interconnects, wiring, etc.

To form the mandrels 104 on substrate 102, a mandrel layer is first deposited onto the substrate 102 and then patterned into the individual mandrels 104 shown in FIG. 1. According to an exemplary embodiment, mandrels 104 are formed from an undoped oxide material. Suitable undoped oxide materials include, but are not limited to, undoped silicon oxide (SiOx). A process such as chemical vapor deposition (CVD), atomic layer deposition (ALD) or physical vapor deposition (PVD) can be used to deposit the mandrel material.

Mandrels 104 can be patterned using a patterning technique such as lithography followed by an etching process. With a lithography and etching process, a lithographic stack (not shown), e.g., photoresist/organic planarizing layer (OPL)/anti-reflective coating (ARC), is typically used to pattern a hardmask (not shown). The pattern from the hardmask is then transferred to the underlying substrate (in this case the mandrel layer). The hardmask is then removed. Suitable etching processes include, but are not limited to, a directional (anisotropic) etching process such as reactive ion etching (RIE). Alternatively, the mandrels 104 can be formed by other suitable techniques, including but not limited to, sidewall image transfer (SIT), self-aligned double patterning (SADP), self-aligned quadruple patterning (SAQP), and other self-aligned multiple patterning (SAMP) techniques. It is notable that the patterning of four mandrels 104 on substrate 102 in the present embodiment is merely provided as an example meant to illustrate the present techniques. For instance, embodiments are contemplated herein where more or fewer mandrels 104 than shown are formed on substrate 102.

According to an exemplary embodiment, mandrels 104 have nanoscale dimensions. Advantageously, use of the above-described pitch multiplying techniques such as SIT, SADP, SAQP or SAMP, permits the patterning of mandrels at a sub-lithographic pitch (i.e., a pitch smaller than what is achievable using direct lithography. For instance, in one exemplary embodiment, mandrels 104 have a height H of from about 20 nanometers (nm) to about 50 nm and ranges therebetween, a width W of from about 5 nm to about 10 nm and ranges therebetween, and a pitch p of from about 10 nm to about 20 nm and ranges therebetween. See FIG. 1. Pitch is defined as the distance from a given point on one mandrel to the same point on the adjacent mandrel.

Spacers 202 are then formed on opposite sides of the mandrels 104. See FIG. 2. Preferably, the spacers 202 are formed from a different material than the mandrels 104 to provide etch selectivity between the spacers 202 and the mandrels 104. This etch selectivity will be leveraged later on in the process to remove (portions) of the mandrels 104 selective to the spacers 202. As provided above, the mandrels 104 can be formed from an undoped oxide material such as SiOx. In that case, a nitride material such as silicon nitride (SiN) and/or silicon oxynitride (SiON) can be used for the spacers 202 to provide etch selectivity vis-á-vis mandrels 104.

According to an exemplary embodiment, spacers 202 are formed by depositing a spacer material (e.g., SiN and/or SiON—see above) onto the mandrels 104. A process such as CVD, ALD or PVD can be used to deposit the spacer material. A directional (anisotropic) etching process such as RIE is then used to pattern the spacer material into the individual spacers shown in FIG. 2. In one exemplary embodiment, spacers 202 have a width Wspacer of from about 5 nm to about 10 nm and ranges therebetween.

Figure 2:
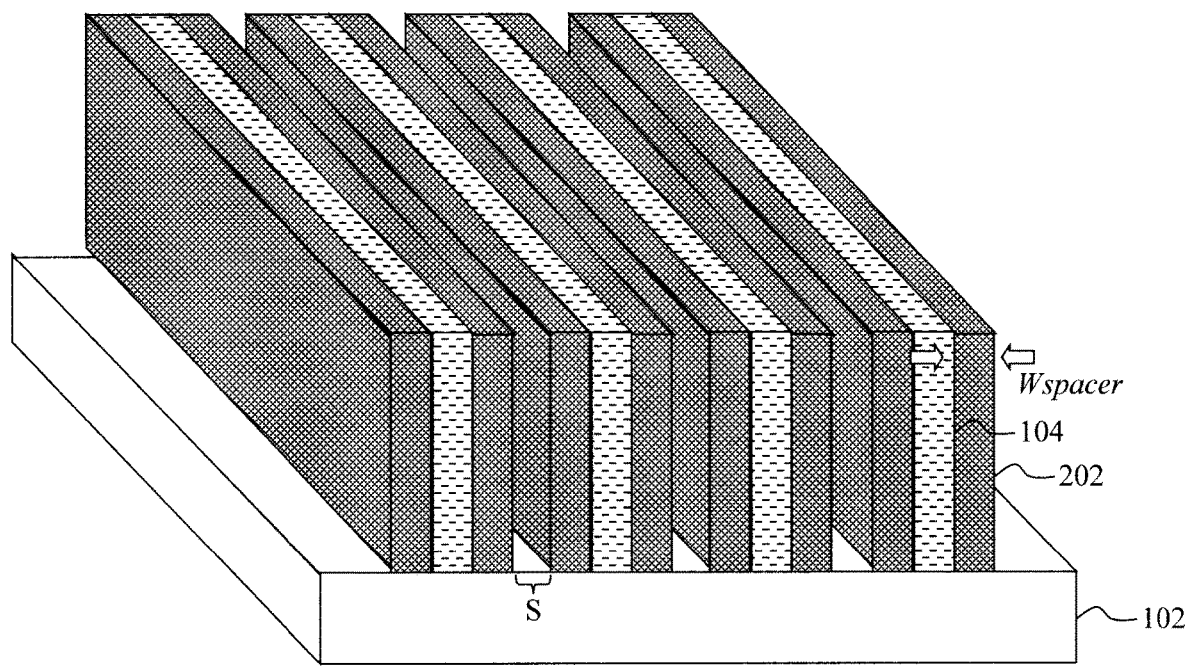
FIG. 2 is a three-dimensional diagram illustrating spacers having been formed on opposite sides of the mandrels according to an embodiment of the present invention.

As shown in FIG. 2, following placement of spacers 202 alongside the mandrels 104, there is a space S present between the spacers 202 alongside adjacent mandrels 104. As will be described in detail below, this space S will be filled with additional mandrel material in the next step.

It is notable, that the above-described process of placing mandrels 104 and then spacers 202 alongside the mandrel can be repeated (in one or more iterations), if so desired, to achieve denser patterning. In that case, although not explicitly shown in the figures, an oxide-selective etch can be used to remove the mandrels 104 selective to the spacers 202 (see above). Additional spacers (not shown) can then be placed alongside spacers 202, effectively doubling the pitch of spacers 202.

The spaces S between the spacers 202 alongside adjacent mandrels 104 are then filled with additional mandrel material, forming mandrels 302. See FIG. 3. According to an exemplary embodiment, mandrels 302 have the same dimensions (i.e., height, width, pitch, etc.) as mandrels 104. For clarity, mandrels 104 and mandrels 302 may also be referred to herein as first mandrels and second mandrels, respectively. As provided above, suitable mandrel materials include, but are not limited to, undoped oxide materials such as undoped SiOx. A process such as CVD, ALD or PVD can be used to deposit the mandrel material into the spaces S. Following deposition, the mandrel material can be planarized using a process such as chemical-mechanical polishing (CMP).

Figure 3:
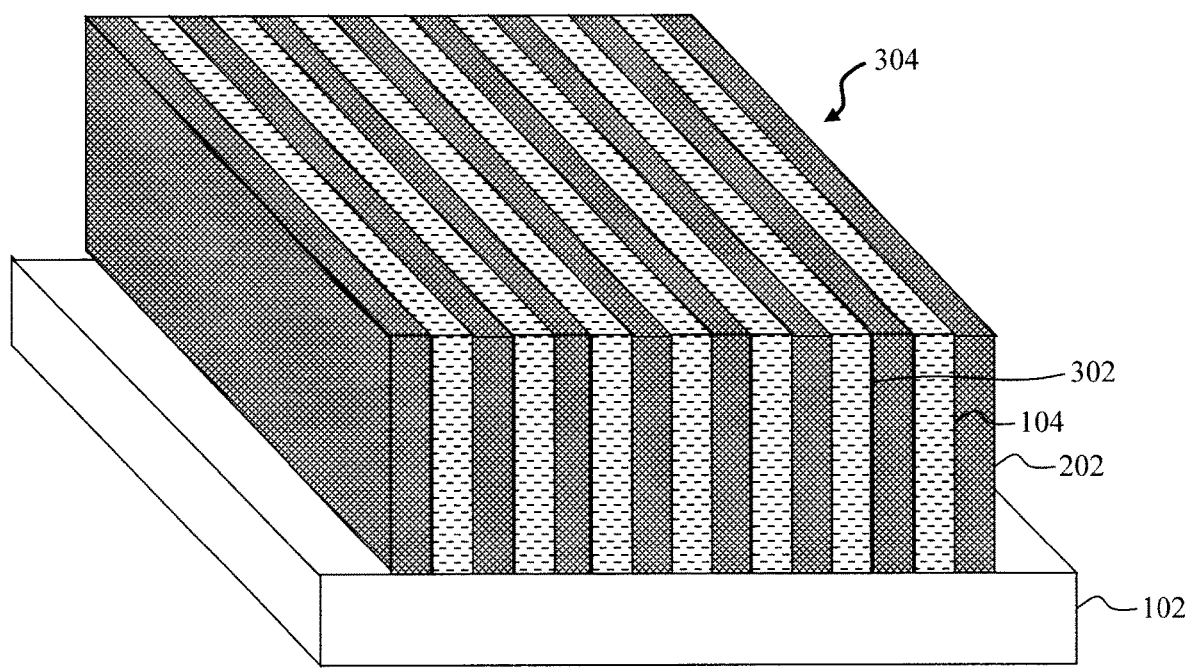
FIG. 3 is a three-dimensional diagram illustrating spaces between the spacers alongside adjacent mandrels having been filled with additional mandrel material according to an embodiment of the present invention.

As shown in FIG. 3, an alternating pattern 304 of spacers 202 and mandrels 104/mandrels 302 is now present on the surface of substrate 102. Using the configuration above where the spacer material is a nitride material (such as SiN and/or SiON) and the mandrels material is an oxide material (such as undoped SiOx) as an example, an alternating nitride/oxide pattern is now present on the surface of wafer 102.

Figure 4:
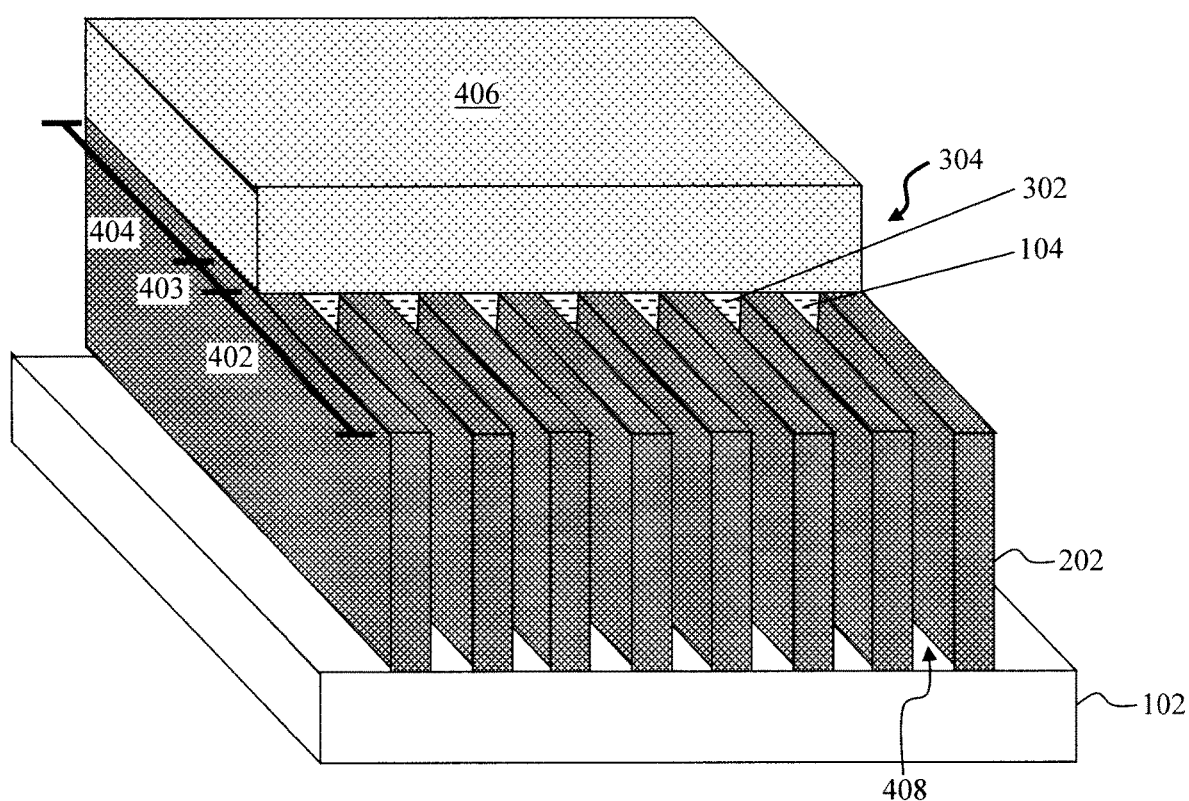
FIG. 4 is a three-dimensional diagram illustrating a mask having been formed over back and central portions of the pattern, and an etch having been performed to selectively remove the mandrels from a front portion of the pattern creating gaps between the spacers according to an embodiment of the present invention.

The next task is to selectively remove portions of the mandrels 104/mandrels 302 from a (first) portion 402 of the pattern 304. To do so, a mask 406 is next formed masking/covering a (second) portion 403 and a (third) portion 404 of the pattern. See FIG. 4. As shown in FIG. 4, in the present example, the first portion 402 encompasses a front portion of the pattern 304, the second portion 403 encompasses a central portion of the pattern 304, and the third portion 404 encompasses a back portion of the pattern 304. As will be described in detail below, the first/front portion 402 and the third/back portion 404 of the pattern 304 will be used to form interleaved/offset electrodes of the device. A channel of the device will be formed in the second/central portion 403, between the first/front portion 402 and third/back portion 404 electrodes.

According to an exemplary embodiment, mask 406 is formed by depositing a hardmask material onto substrate 102 over the pattern 304. Suitable hardmask materials include, but are not limited to, a carbon-containing hardmask material such as amorphous carbon. Use of a carbon-containing hardmask will enable the removal of mask 406 selective to the underlying (e.g., nitride) spacers 202 and (e.g., oxide) mandrels 104/mandrels 302. The hardmask material can be deposited using a process such as plasma-enhanced CVD (PECVD) or a casting process such as spin coating or spray coating. Lithography and etching techniques (see above) are then employed to pattern the hardmask material into the patterned mask 406 shown in FIG. 4.

An etch is next performed to selectively remove portions of the mandrels 104/mandrels 302 from the first/front portion 402 of the pattern 304. According to an exemplary embodiment, a directional (anisotropic) etching process such as RIE is employed to remove the mandrels 104/mandrels 302 from first/front portion 402. As provided above, mandrels 104/mandrels 302 can be formed from an oxide material such as SiOx. In that case, an oxide-selective RIE can be used to remove the portions of the mandrels 104/mandrels 302 from the first/front portion 402 of pattern 304 selective to spacers 202. Notably, as shown in FIG. 4, mask 406 is present over and protecting the portions of the mandrels 104/mandrels 302 in the second/central portion 403 and the third/back portion 404 of the pattern 304.

Figure 5:
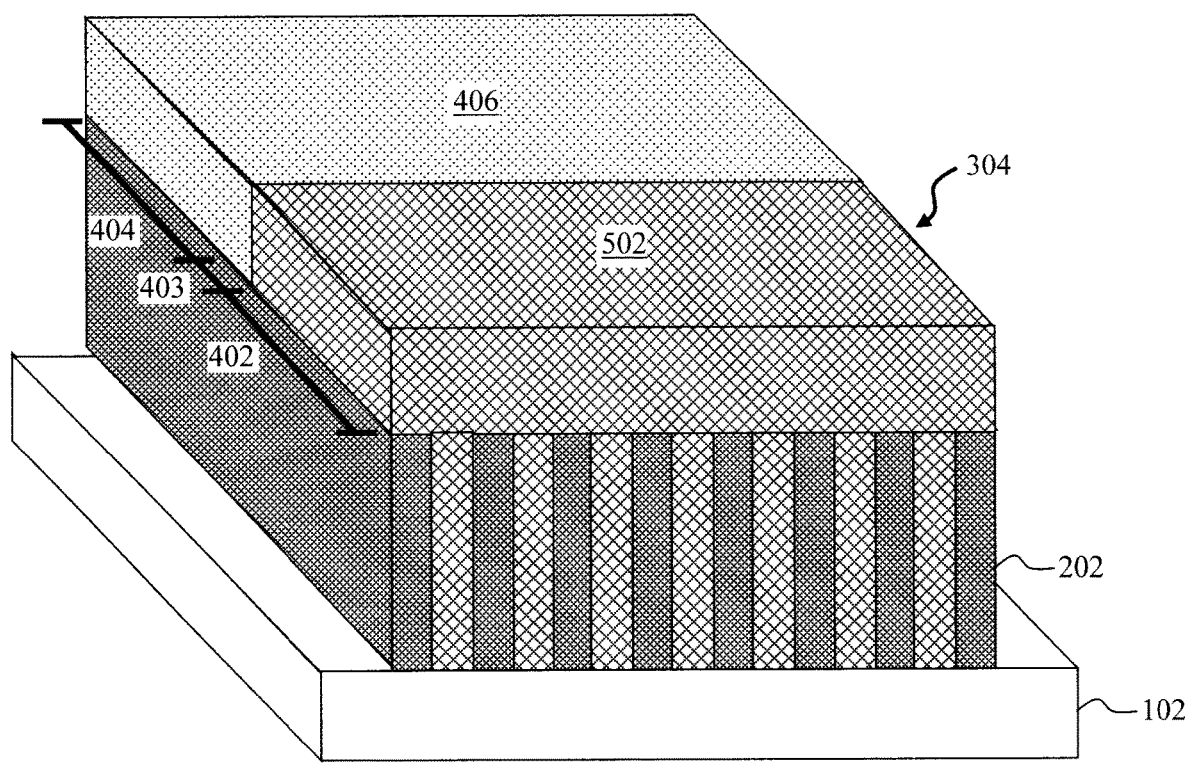
FIG. 5 is a three-dimensional diagram illustrating the gaps between the spacers having been filled with a sacrificial material according to an embodiment of the present invention.

Removal of mandrels 104/mandrels 302 in this manner creates gaps 408 between the spacers 202 in the first/front portion 402 of pattern 304. Ultimately, these gaps 408 will be filled with a conductor to form the electrodes on one side of the channel. However, at this stage in the process, gaps 408 are first filled with a sacrificial material 502. See FIG. 5. The term 'sacrificial' as used herein refers to the notion that material 502 will be used early on in the process to place a channel spacer, and then later removed and replaced with the electrode conductor. See below. Suitable sacrificial materials include, but are not limited to, amorphous silicon and/or poly-silicon. A process such as CVD, ALD or PVD can be employed to deposit the sacrificial material 502 into the gaps 408. As shown in FIG. 5, the deposited sacrificial material 502 overfills the gaps 408 and is then planarized to the top of mask 406. The sacrificial material 502 can be planarized using a process such as CMP.

Figure 6:
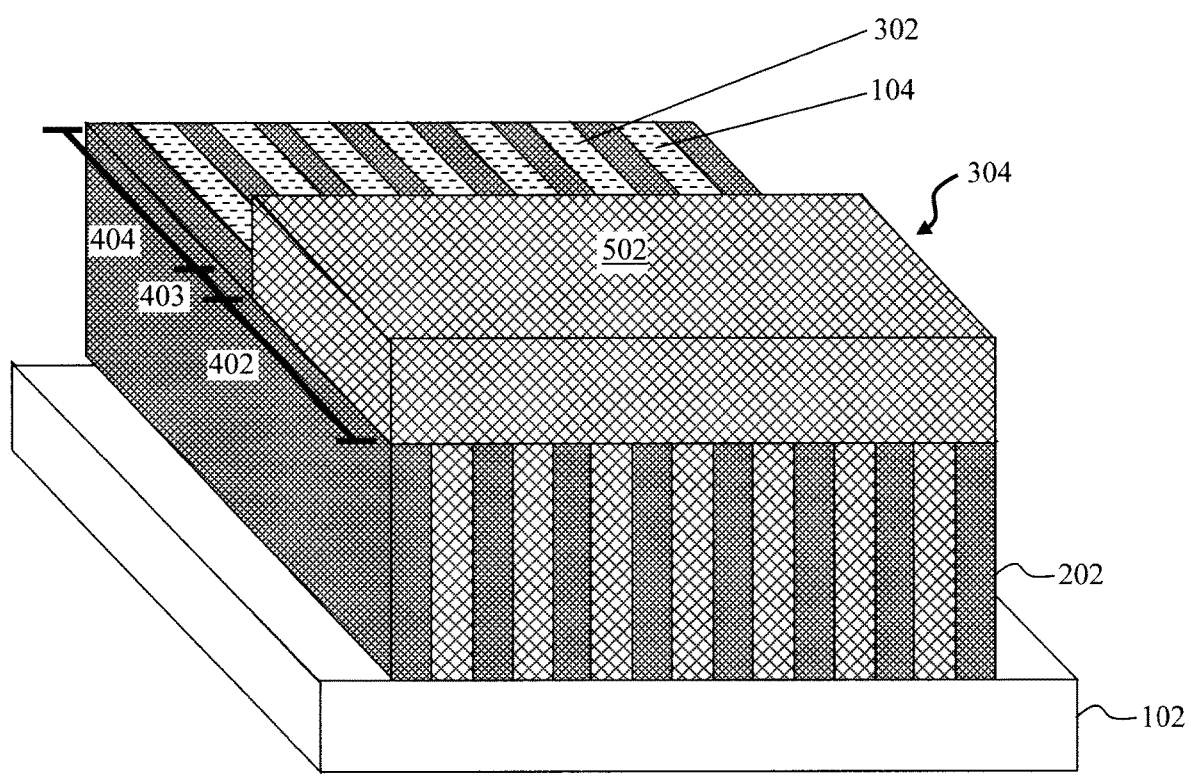
FIG. 6 is a three-dimensional diagram illustrating the mask having been removed according to an embodiment of the present invention.
Figure 7:
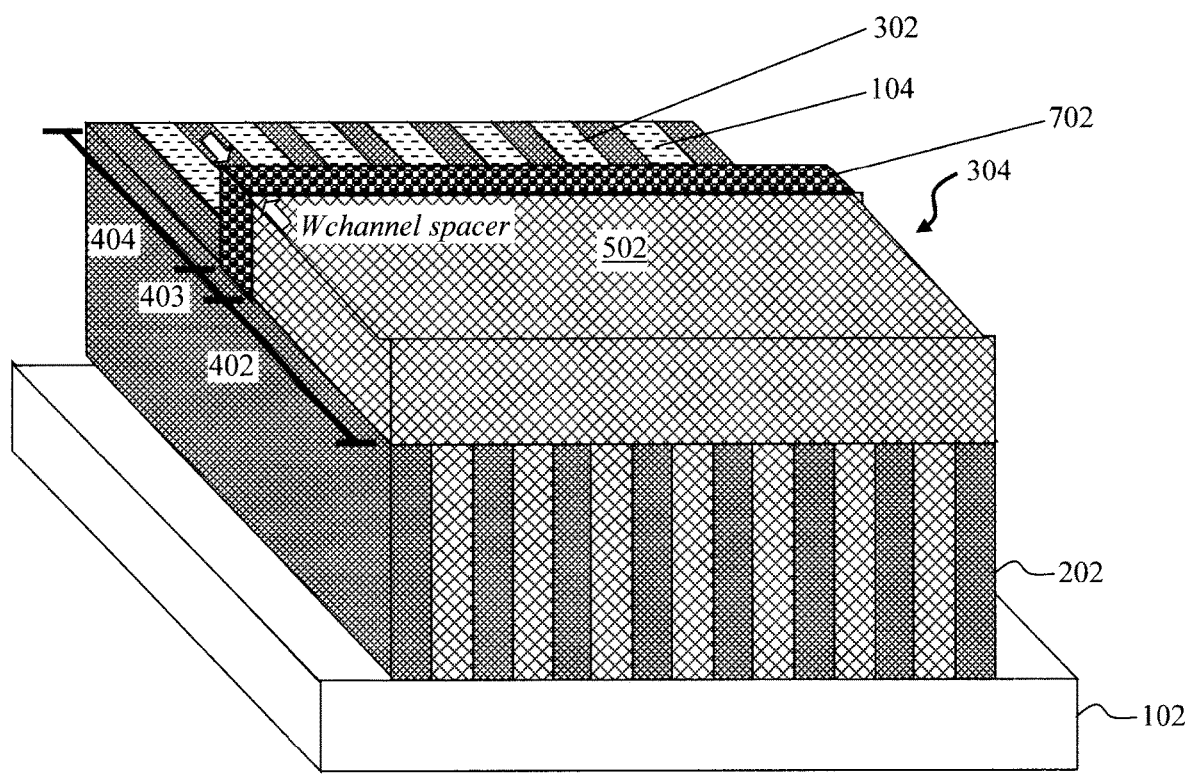
FIG. 7 is a three-dimensional diagram illustrating a channel spacer having been formed over the central portion of the pattern according to an embodiment of the present invention.
Figure 8:
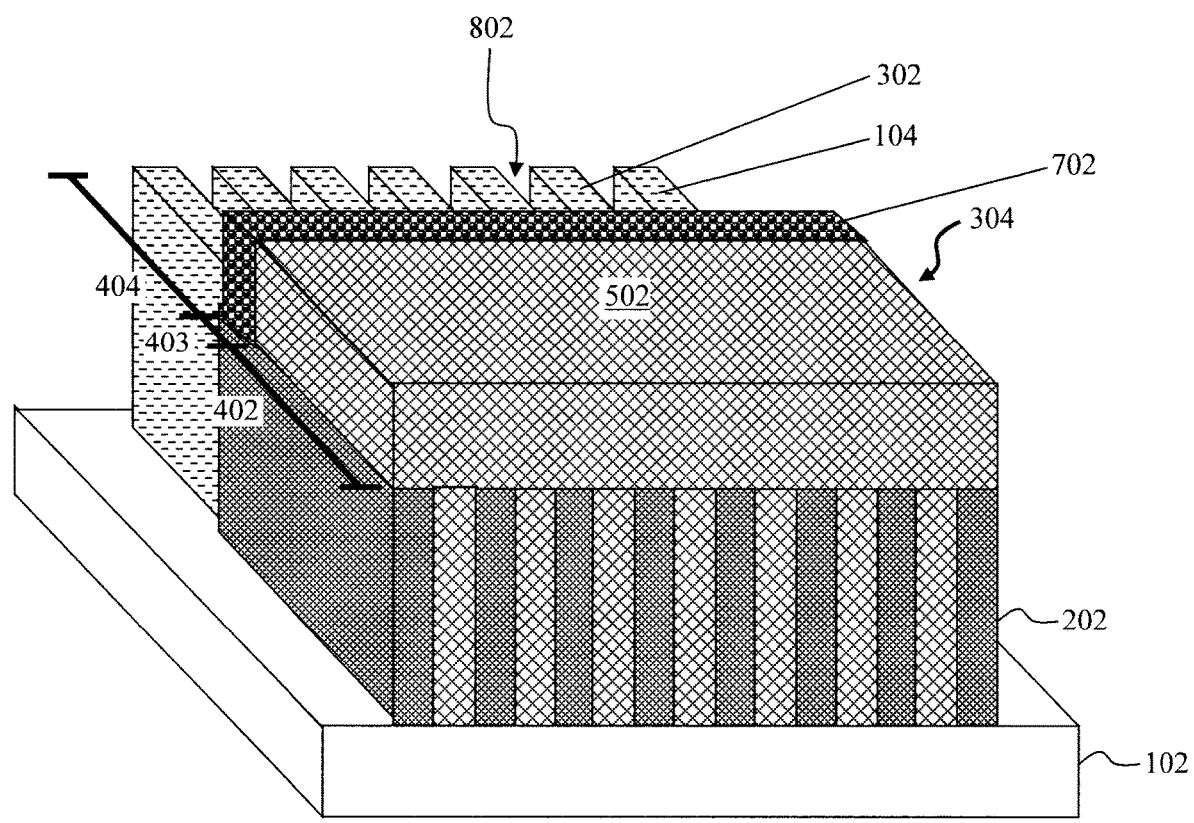
FIG. 8 is a three-dimensional diagram illustrating the spacers having been removed from the back portion of the pattern creating gaps between the mandrels according to an embodiment of the present invention.

Mask 406 is next selectively removed from the second/central portion 403 and third/back portion 404 of the pattern 304 exposing the underlying spacers 202/mandrels 104/mandrels 302. See FIG. 6. As shown in FIG. 6, sacrificial material 502 remains in the first/front portion 402 of pattern 304 filling the gaps 408 between the spacers 202. As provided above, mask 406 can be formed from a carbon-containing hardmask material such as amorphous carbon. Amorphous carbon is an ashable material. Thus, according to an exemplary embodiment, mask 406 is removed selective to the underlying (e.g., nitride) spacers 202 and (e.g., oxide) mandrels 104/mandrels 302 using oxygen-containing plasma ashing.

Removal of the mask 406 enables the placement of a channel spacer 702 over the second/central portion 403 of the pattern 304 adjacent to sacrificial material 502. See FIG. 7. Namely, as provided above, mask 406 had been present over the second/central portion 403 and third/back portion 404 of the pattern 304 in which a channel and electrodes of the device will be formed, respectively. Removal of the mask 406 is needed so that the full height channel spacer 702 (relative to the top of sacrificial material 502) can be formed. Suitable materials for the channel spacer 702 include, but are not limited to carbon-containing spacer materials such as amorphous carbon. Use of a carbon-containing spacer material will enable the selective removal of sacrificial material 502 (e.g., amorphous silicon and/or poly-silicon) later on in the process (see below). The spacer material can be deposited using a CVD process such as PECVD or a casting process such as spin coating or spray coating. Lithography and etching techniques (see above) can then be employed to pattern the spacer material into the channel spacer 702 shown in FIG. 7.

In one embodiment, the channel of the device has nanoscale dimensions, i.e., the device has a nanochannel. In that case, according to an exemplary embodiment, channel spacer 702 has a width Wchannel spacer of from about 2 nm to about 10 nm and ranges therebetween. See FIG. 7.

With sacrificial material 502 covering the first/front portion 402 and channel spacer 702 covering the second/central portion 403 of pattern 304, an etch is next performed to selectively remove portions of the spacers 202 from the third/back portion 404 of the pattern 304. See FIG. 8. According to an exemplary embodiment, a directional (anisotropic) etching process such as RIE is employed to remove to the portions of the spacers 202 from third/back portion 404. As provided above, spacers 202 can be formed from a nitride material such as SiN and/or SiON. In that case, a nitride-selective RIE can be used to remove the portions of spacers 202 from the third/back portion 404 of pattern 304 selective to (e.g., oxide) mandrels 104/mandrels 302.

Removal of spacers 202 in this manner creates gaps 802 between the mandrels 104/mandrels 302 in the third/back portion 404 of pattern 304. Later in the process, these gaps 802 will be filled with a conductor to form the electrodes on one side of the channel. Notably, the mandrels 104/mandrels 302 in the third/back portion 404 of pattern 304 are offset from the spacers 202 present in the first/front portion 402 of pattern 304. Thus, as will be described in detail below, electrodes formed in the gaps 802 too will be offset from the electrodes formed (on an opposite side of the channel) in the gaps 408 (see, e.g., FIG. 4—described above) between spacers 202. As highlighted above, having offset or interleaved electrodes is a unique aspect of the present device design that advantageously improves resolution thereby enabling a much finer level of control and manipulation of molecules.

Figure 9:
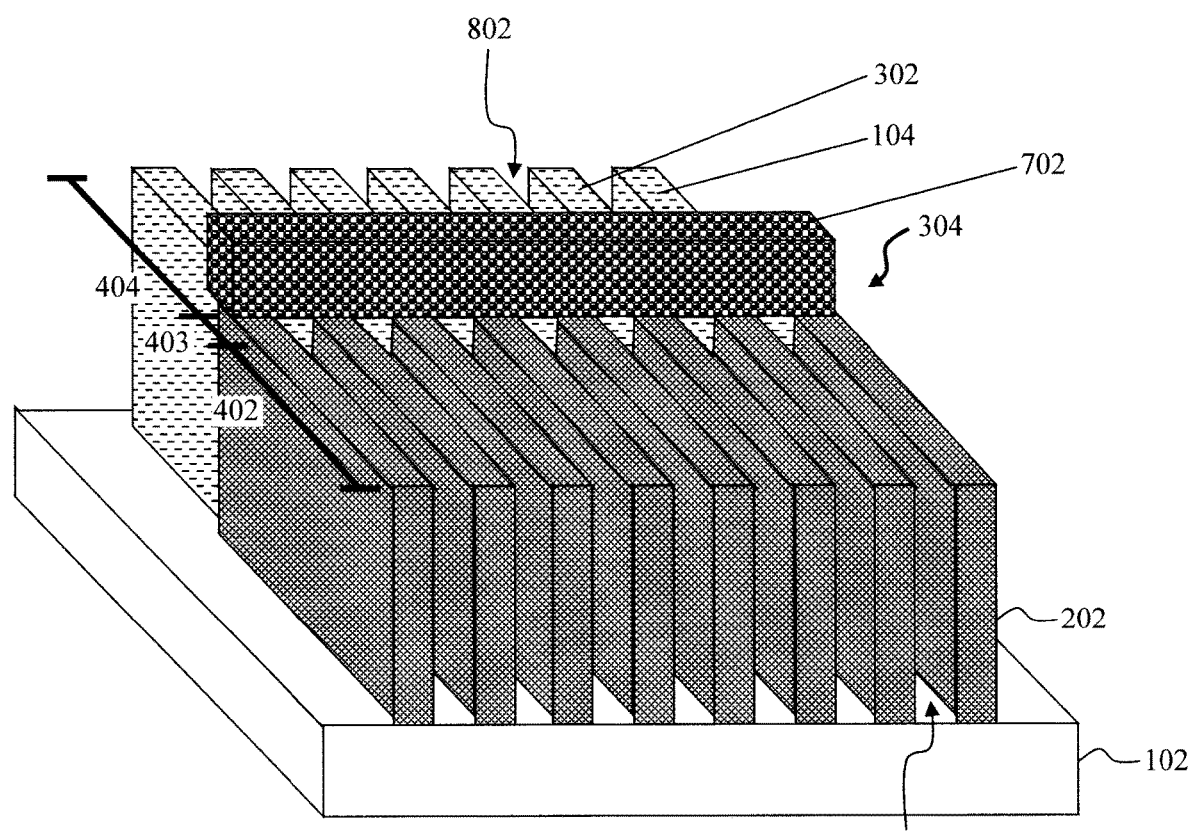
FIG. 9 is a three-dimensional diagram illustrating the sacrificial material having been selectively removed according to an embodiment of the present invention.
Figure 10:
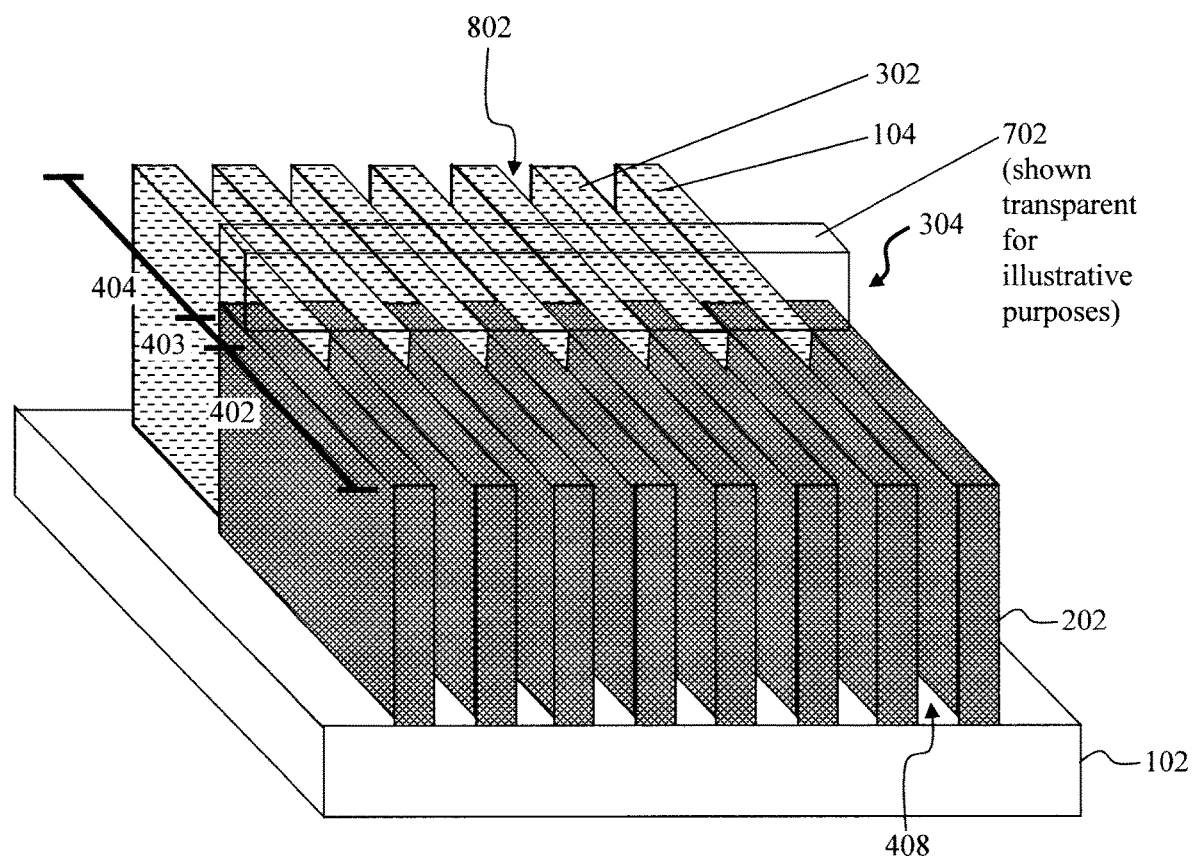
FIG. 10 is a three-dimensional diagram illustrating that the gaps between the spacers (in the front portion of the pattern) are offset from the gaps between the mandrels (in the back portion of the pattern) according to an embodiment of the present invention.

Next, sacrificial material 502 is selectively removed from the first/front portion 402 of pattern 304 and from in between spacers 202. See FIG. 9. As shown in FIG. 9, removal of sacrificial material 502 re-opens gaps 408 between spacers 202. According to an exemplary embodiment, a directional (anisotropic) etching process such as RIE is employed to remove sacrificial material 502. As provided above, suitable materials for sacrificial material 502 include, but are not limited to, amorphous silicon and/or poly-silicon. In that case, a silicon-selective RIE can be used to remove sacrificial material 502 selective to (e.g., nitride) spacers 202, (e.g., oxide) mandrels 104/mandrels 302, and (e.g., amorphous carbon) channel spacer 702.

As shown in FIG. 9, channel spacer 702 remains covering the second/central portion 403 of pattern 304. However, for clarity, if one were to visualize the structure looking through the channel spacer 702 (see FIG. 10 where channel spacer 702 is shown transparent for illustrative purposes only) it can be seen that the gaps 408 between spacers 202 (in the first region 402 of pattern 304) are offset from the gaps 802 between the mandrels 104/mandrels 302 (in the third region 404 of pattern 304). Thus, when the gaps 408 and gaps 802 are filled with a conductor to form electrodes of the device, those electrodes formed in the gaps 408 and gaps 802 too will be offset from one another, i.e., interleaved.

Figure 11:
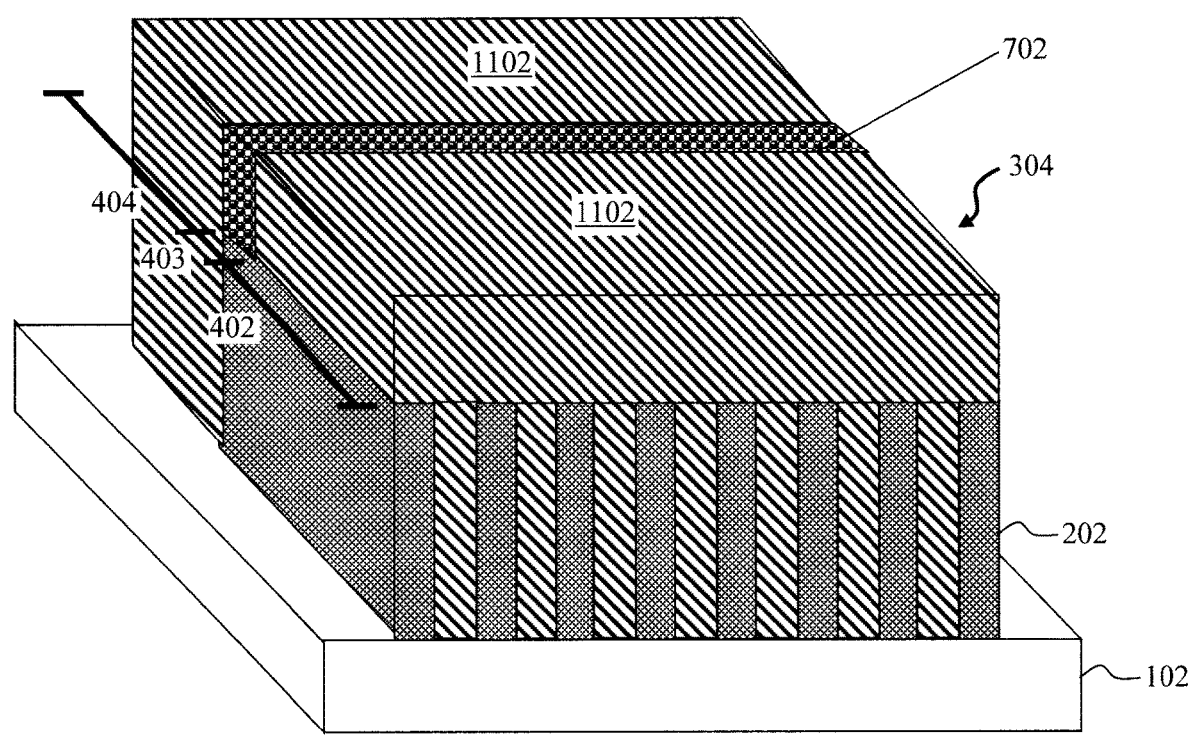
FIG. 11 is a three-dimensional diagram illustrating the gaps between the spacers and the gaps between the mandrels having been filled with a conductor according to an embodiment of the present invention.

Namely, following from FIG. 9, the gaps 408 between spacers 202 (in the first/front portion 402 of pattern 304) and the gaps 802 between the mandrels 104/mandrels 302 (in the third/back portion 404 of pattern 304) are next filled with a conductor 1102. See FIG. 11. Suitable conductors include, but are not limited to, copper (Cu), tungsten (W), cobalt (Co) and/or ruthenium (Ru). A process such as sputtering, evaporation, or electrochemical plating can be employed to deposit conductor 1102 into the gaps 408 and the gaps 802. As shown in FIG. 11, the conductor 1102 overfills the gaps 408 and the gaps 802 and is then planarized to the top of channel spacer 702. The conductor 1102 can be planarized using a process such as CMP.

Figure 12:
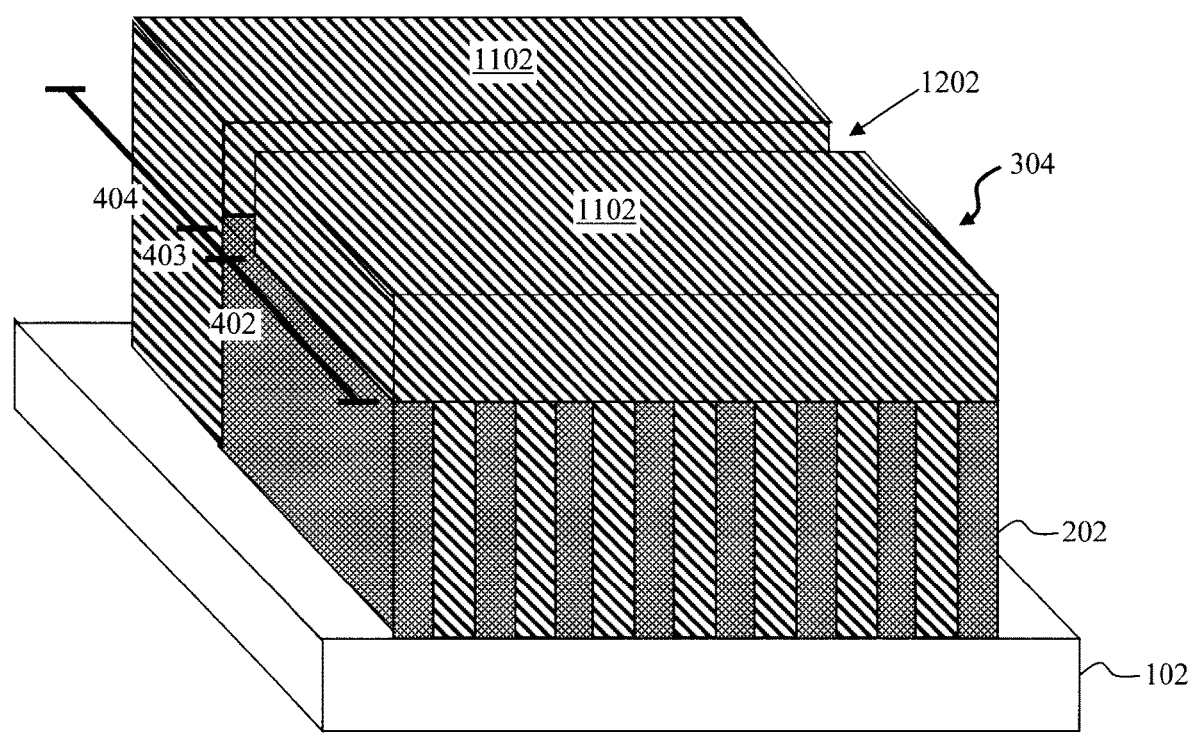
FIG. 12 is a three-dimensional diagram illustrating the channel spacer having been removed forming a trench in the conductor according to an embodiment of the present invention.

As shown in FIG. 11, the channel spacer 702 now separates the conductor 1102 over the first/front portion 402 from the conductor 1102 over the third/back portion 404 of pattern 304. The channel spacer 702 is then selectively removed. See FIG. 12. As shown in FIG. 12, removal of channel spacer 702 forms a trench 1202 in between the conductor 1102 over the first/front portion 402 and the conductor 1102 over the third/back portion 404 of pattern 304.

As provided above, channel spacer 702 can be formed from a carbon-containing spacer material such as amorphous carbon. Amorphous carbon is an ashable material. Thus, according to an exemplary embodiment, channel spacer 702 is removed selective to conductor 1102 using oxygen-containing plasma ashing.

Figure 13:
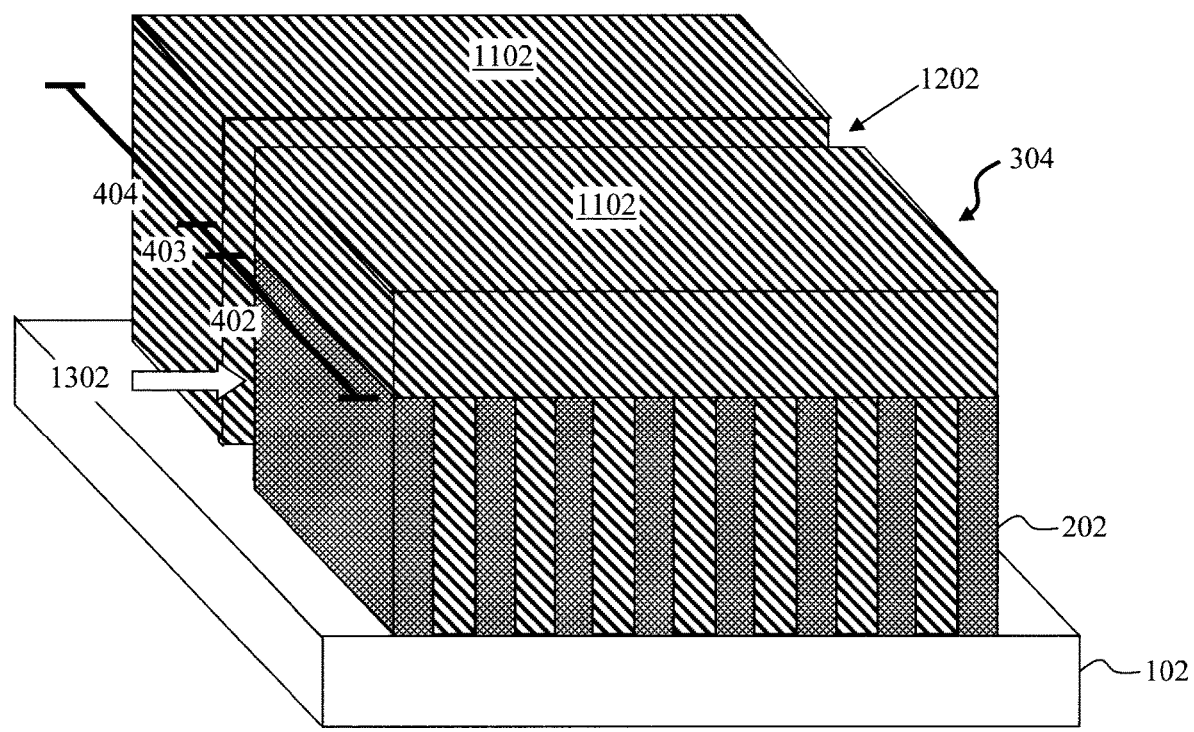
FIG. 13 is a three-dimensional diagram illustrating the spacers and the mandrels in the central portion of the pattern having been removed through the trench forming a channel according to an embodiment of the present invention.

Opening of trench 1202 in conductor 1102 exposes the underlying portions of spacers 202 and mandrels 104/mandrels 302 in the second/central portion 403 of the pattern 304. An etch is then used to remove these portions of spacers 202 and mandrels 104/mandrels 302 through trench 1202. See FIG. 13. As shown in FIG. 13, this etch step forms a channel 1302 in between the first/front portion 402 and the third/back portion 404 of the pattern 304. According to an exemplary embodiment, a directional (anisotropic) etching process such as RIE is employed for the channel etch. As provided above, the spacers 202 can be formed from a nitride material, and the mandrels 104/mandrels 302 can be formed from an oxide material. Thus, in that case, an oxide/nitride-selective RIE (or combination of RIE steps) can be used to pattern channel 1302 through trench 1202. Based on the dimensions of channel spacer 702 (see above), according to an exemplary embodiment, channel 1302 is a nanochannel having a width of from about 2 nm to about 10 nm and ranges therebetween.

Figure 14:
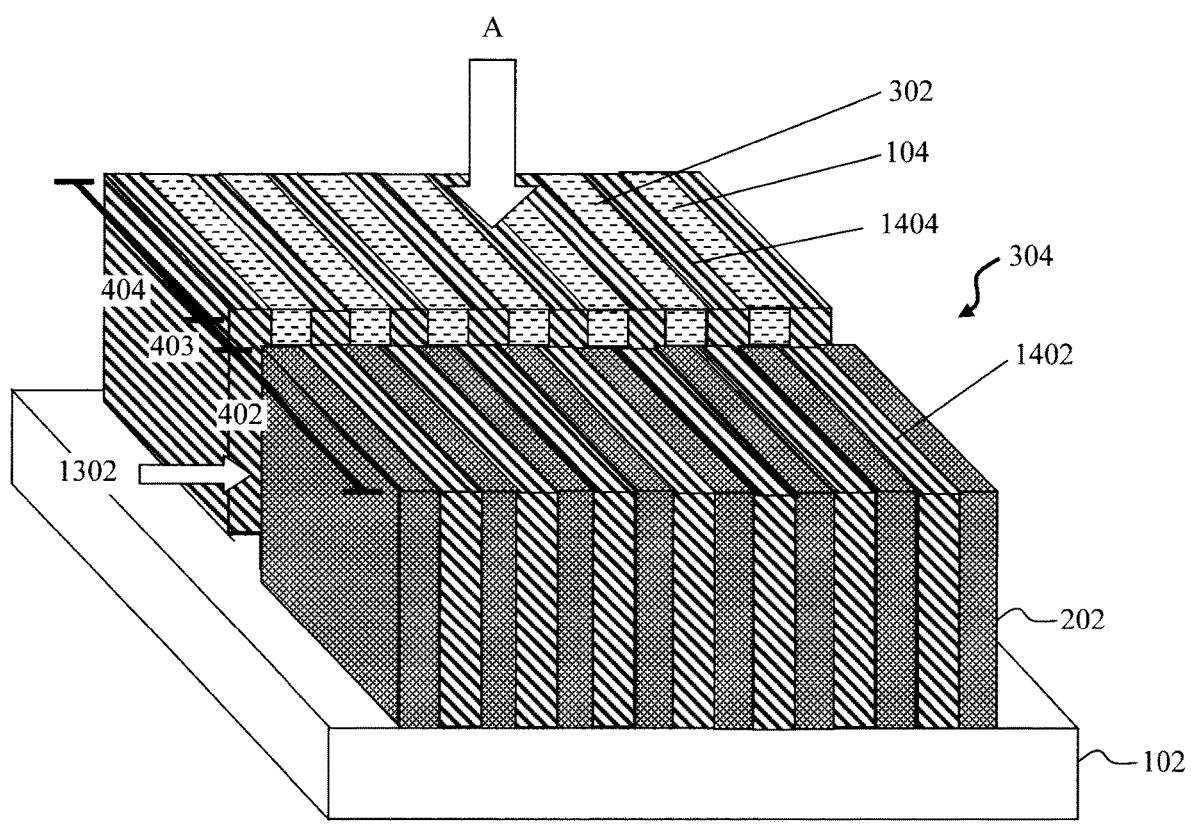
FIG. 14 is a three-dimensional diagram illustrating the conductor having been recessed forming first/second electrodes on opposite sides of the channel according to an embodiment of the present invention.
Figure 15:
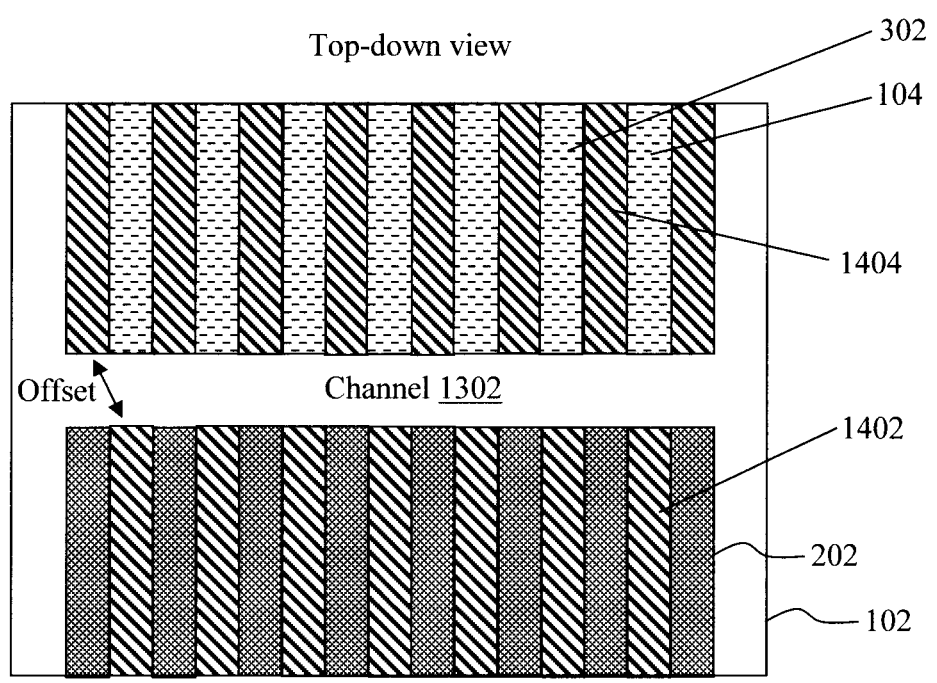
FIG. 15 is a top-down diagram illustrating that the first electrodes are offset from the second electrodes across the channel according to an embodiment of the present invention.
Figure 16:
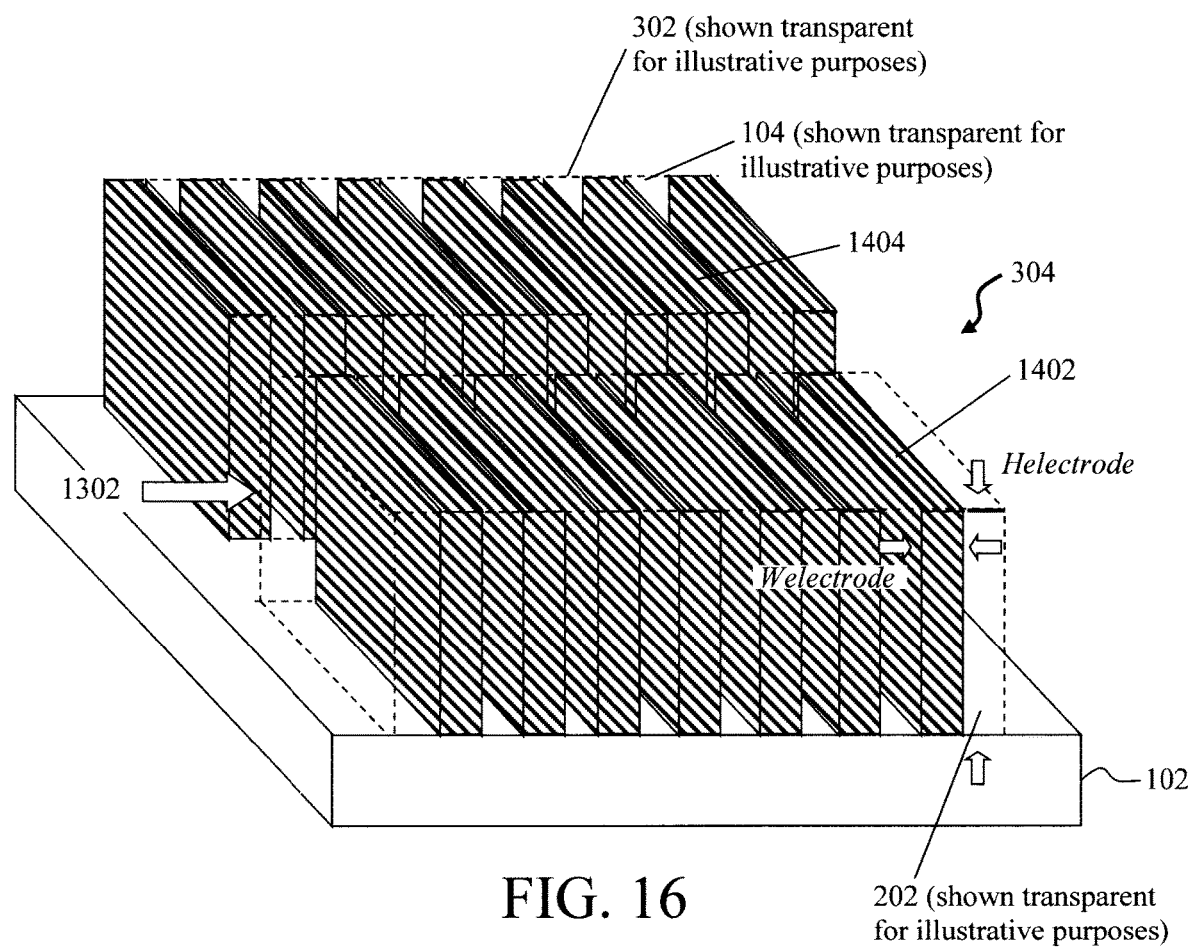
FIG. 16 is a three-dimensional diagram illustrating that the first electrodes are offset from the second electrodes across the channel according to an embodiment of the present invention.

The conductor 1102 is then recessed. See FIG. 14. A process such as CMP or a metal-selective etch can be used to recess conductor 1102 down to spacers 202 (in the first/front portion 402 of the pattern 304) and mandrels 104/mandrels 302 (in the third/back portion 404 of the pattern 304). Recessing the conductor 1102 forms an array of electrodes on both sides of the channel 1302. Namely, as shown in FIG. 14, first electrodes 1402 are present in between spacers 202 on a first side of channel 1302, and second electrodes 1404 are present in between mandrels 104/mandrels 302 on a second/opposite side of channel 1302.

When viewed from the top-down (i.e., from viewpoint A), it can be seen that the first electrodes 1402 are offset from second electrodes 1404 across channel 1302. See FIG. 15. This configuration is what is referred to herein as 'interleaving' the electrodes.

For instance, if one were to visualize the structure without the mandrels 104/mandrels 302 and spacers 202 (see FIG. 16 where mandrels 104/mandrels 302 and spacers 202 are transparent for illustrative purposes only) it can be seen that the first electrodes 1402 are offset from second electrodes 1404 across channel 1302, i.e., interleaved. According to an exemplary embodiment, each of first/second electrodes 1402/1404 has a width Welectrode of from about 5 nm to about 10 nm and ranges therebetween, and a height Helectrode of from about 20 nm to about 50 nm and ranges therebetween. See FIG. 16.

As highlighted above, the present 3D device structures permit the electro-kinetic control of individual molecules using the dipoles inherent in the subject material. See, for example, FIG. 17. As is known in the art, polar molecules have a partial negative end and a partial positive end. Dipole-dipole interactions occur when the partial positive end of one molecule is attracted to the partial negative end of another molecule, and vice versa. These interactions can also be used to control the orientation and movement of individual polar molecules with the nanochannel.

Figure 17:
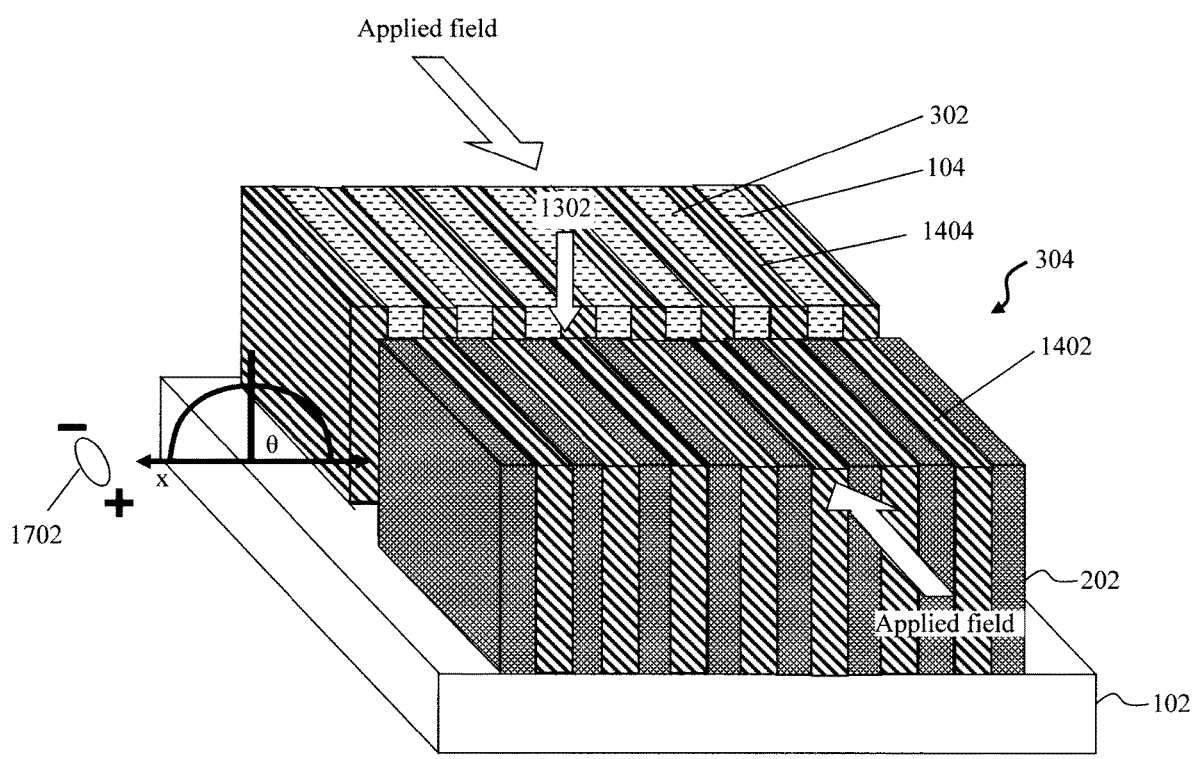
FIG. 17 is a three-dimensional diagram illustrating that, during operation, an electric field applied to the first/second electrodes will electrokinetically orient and/or locomote a polar molecule in the channel according to an embodiment of the present invention.

For instance, as shown in FIG. 17, during operation a field applied selectively to portions of a polar molecule 1702 will electrokinetically orient (see angle θ) and/or locomote (along x-direction) the polar molecule 1702 in the channel 1302 as a result of dynamic electric field applied to the first/second electrodes 1402/1404. Polar molecule 1702 can be present in a fluid medium such as a solvent. Thus, in addition to electrokinetics, a positive pressure of the fluid can also be employed to move molecule 1702 through channel 1302.

Advantageously, first/second electrodes 1402/1404 can be controlled individually to locomote and/or orient polar molecule 1702. See, for example, the electric field being applied dynamically to the electrodes 1402/1404 on opposite sides of channel 1302. Further, as provided above, first/second electrodes 1402/1404 are offset from one another on opposite sides of the channel 1302. Interleaving the electrodes 1402/1404 in this manner enables a much finer level of control and manipulation of the molecule 1702.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method comprising:
    forming a pattern of mandrels and spacers on a substrate, wherein the mandrels and the spacers are arranged in an alternating fashion, and wherein the pattern comprises a first portion, a second portion, and a third portion;
    forming first gaps between the spacers located in the first portion of the pattern by selectively removing the mandrels located in the first portion of the pattern;
    forming second gaps between the mandrels located in the third portion by selectively removing the spacers located in the third portion of the pattern;
    forming first electrodes in the first gaps between the spacers located in the first portion of the pattern;
    forming second electrodes in the second gaps between the mandrels located in the third portion; and
    selectively removing the second portion of the pattern thereby forming a channel between the first portion of the pattern and the third portion of the pattern, wherein the first electrodes and the second electrodes are offset from one another across the channel.

2. The method of claim 1, wherein forming the pattern on the substrate comprises:
    forming first mandrels on the substrate;
    forming the spacers on the substrate along sidewalls of the first mandrels; and
    forming second mandrels on the substrate, the second mandrels located between the spacers.

3. The method of claim 1, wherein forming the first gaps between the spacers located in the first portion of the pattern comprises:
    forming a mask covering both the second portion and the third portion; and
    selectively removing the mandrels from the first portion.

4. The method of claim 3, wherein forming the second gaps between the mandrels located in the third portion comprises:
    filling the first gaps between the spacers in the first portion with a sacrificial material prior to selectively removing the spacers from the third portion of the pattern.

5. The method of claim 1, wherein forming the first electrodes in the first gaps and forming the second electrodes in the second gaps further comprises:
    forming a channel spacer over the second portion of the pattern; and
    depositing a conductor on the pattern to fill the first gaps and the second gaps.

6. The method of claim 5, further comprising:
    selectively removing the channel spacer to form a trench in the conductor, the trench being located over the second portion of the pattern.

7. The method of claim 6, further comprising:
    recessing the conductor to expose top surfaces of the spacers in the first portion and to expose top surfaces of the mandrels in the third portion.

8. The method of claim 1, wherein the mandrels comprise an undoped silicon oxide (SiOx), and wherein the spacers comprise a nitride material.

9. A method comprising:
    forming a pattern of mandrels and spacers on a substrate, wherein the mandrels and the spacers are arranged in an alternating fashion, and wherein the pattern comprises a first portion, a second portion, and a third portion;
    forming first gaps between the spacers located in the first portion of the pattern;
    forming second gaps between the mandrels located in the third portion of the pattern;
    forming first electrodes in the first gaps;
    forming second electrodes in the second gaps; and
    selectively removing the second portion of the pattern thereby forming a channel, wherein the first electrodes and the second electrodes are offset from one another across the channel.

10. The method of claim 8, wherein forming the pattern on the substrate comprises:
    forming first mandrels on the substrate;
    forming the spacers on the substrate along sidewalls of the first mandrels; and
    forming second mandrels on the substrate, the second mandrels located between the spacers.

11. The method of claim 9, wherein forming the first gaps between the spacers located in the first portion of the pattern comprises:
    forming a mask covering both the second portion and the third portion; and
    selectively removing the mandrels from the first portion.

12. The method of claim 11, wherein forming the second gaps between the mandrels located in the third portion comprises:
    filling the first gaps between the spacers in the first portion with a sacrificial material prior to selectively removing the spacers from the third portion of the pattern.

13. The method of claim 9, wherein forming the first electrodes in the first gaps and forming the second electrodes in the second gaps further comprises:
    forming a channel spacer over the second portion of the pattern; and
    depositing a conductor on the pattern to fill the first gaps and the second gaps.

14. The method of claim 13, further comprising:
    selectively removing the channel spacer to form a trench in the conductor, the trench being located over the second portion of the pattern.

15. The method of claim 14, further comprising:
    recessing the conductor to expose top surfaces of the spacers in the first portion and to expose top surfaces of the mandrels in the third portion.

16. The method of claim 9, wherein the mandrels comprise an undoped silicon oxide (SiOx), and wherein the spacers comprise a nitride material.

17. A method comprising:
    forming a first series of electrodes in a first region, wherein the electrodes in the first series of electrodes are separated from one another by a series of spacers;
    forming a second series of electrodes in a second region, wherein the electrodes in the second series of electrodes are separated from one another by a series of mandrels; and
    forming a channel between the first series of electrodes in the first region and the second series of electrodes in the second region, wherein the electrodes in the first series of electrodes are offset across the channel from the electrodes in the second series of electrodes.

18. The method of claim 17, wherein forming the first series of electrodes comprises:

forming a series of mandrels on a substrate in the first region, wherein mandrels in the series of mandrels are separated from one another by the series of spacers;

removing the series of mandrels selective to the series of spacers; and forming the first series of electrodes in spaces created by removing the series of mandrels selective to the series of spacers.

19. The method of claim 17, wherein forming the second series of electrodes comprises:

forming a series of spacers on a substrate in the second region, wherein the spacers in the series of spacers are separated from one another by the series of mandrels;

removing the series of spacers selective to the series of mandrels; and forming the second series of electrodes in spaces created by removing the series of spacers selective to the series of mandrels.

20. The method of claim 17, wherein the series of mandrels are made from an undoped silicon oxide (SiOx), and wherein the series of spacers are made from a nitride material.

\* \* \* \* \*